(12) United States Patent  (10) Patent No.: US 8,960,561 B2
Kimura et al.  (45) Date of Patent: *Feb. 24, 2015

(54) WIRELESS COMMUNICATION DEVICE

(71) Applicant: Murata Manufacturing Co., Ltd., Nagaokakyo-shi, Kyoto-fu (JP)

(72) Inventors: Ikuhei Kimura, Nagaokakyo (JP); Nobuo Ikemoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/187,364

(22) Filed: Feb. 24, 2014

(65) Prior Publication Data

US 2014/0166764 A1 Jun. 19, 2014

Related U.S. Application Data

(63) Continuation of application No. 14/082,435, filed on Nov. 18, 2013, now Pat. No. 8,757,502, which is a continuation of application No. 13/789,761, filed on Mar. 8, 2013, now Pat. No. 8,613,395, which is a continuation of application No. PCT/JP2012/053344, filed on Feb. 14, 2012.

(30) Foreign Application Priority Data

Feb. 28, 2011 (JP) ................................ 2011-042205

(51) Int. Cl.
*G06K 19/06* (2006.01)
*H01Q 1/38* (2006.01)
(Continued)

(52) U.S. Cl.
CPC ............ *H01Q 1/38* (2013.01); *G06K 19/07767* (2013.01); *H01Q 1/2225* (2013.01); *H01Q 7/00* (2013.01); *G06K 19/07786* (2013.01)
USPC ....................................................... 235/492

(58) Field of Classification Search
USPC ........................ 235/492; 343/700 R, 700 MS
See application file for complete search history.

(56) References Cited

U.S. PATENT DOCUMENTS 3,364,564 A  1/1968 Kurtz et al.
4,794,397 A  12/1988 Ohe et al.
(Continued)

FOREIGN PATENT DOCUMENTS

CA  2 279 176 A1  7/1998
CN  101460964 A  6/2009
(Continued)

OTHER PUBLICATIONS

Official Communication issued in International Patent Application No. PCT/JP2009/069486, mailed on Mar. 2, 2010.
(Continued)

*Primary Examiner* — Seung Lee
(74) *Attorney, Agent, or Firm* — Keating & Bennett, LLP (57) ABSTRACT

A wireless communication device includes a wireless IC chip that processes a high-frequency signal and a feeding substrate including a coil conductor, a plane conductor, and a matching circuit that is connected to the wireless IC chip and that has a predetermined resonant frequency. The coil conductor and the plane conductor are connected to the matching circuit. The wireless communication device, when used by itself, operates as a monopole antenna in which the plane conductor functions as a ground and the coil conductor functions as a radiation element. When a conductive object is in a vicinity of the plane conductor, the plane conductor is coupled to the conductive object, and the wireless communication device operates as a dipole antenna in which the plane conductor and the conductive object function as a first radiation element and the coil conductor functions as a second radiation element.

11 Claims, 5 Drawing Sheets

(51) Int. Cl.
*G06K 19/077* (2006.01)
*H01Q 1/22* (2006.01)
*H01Q 7/00* (2006.01)

(56) References Cited

U.S. PATENT DOCUMENTS

| | | | |
|---|---|---|---|
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,243,045 B1 | 6/2001 | Ishibashi |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,340,932 B1 | 1/2002 | Lastinger |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,956,481 B1 | 10/2005 | Cole |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 2001/0011012 A1 | 8/2001 | Hino et al. |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2002/0186004 A1 | 12/2002 | Prazeres da Costa et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2003/0206095 A1 | 11/2003 | Chaloner et al. |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0001031 A1 | 1/2005 | Akiho et al. |
| 2005/0007296 A1 | 1/2005 | Endo et al. |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0133605 A1 | 6/2005 | Koyama et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0162331 A1 | 7/2005 | Endo et al. |
| 2005/0232412 A1 | 10/2005 | Ichihara et al. |
| 2005/0236623 A1 | 10/2005 | Takechi et al. |
| 2005/0253726 A1 | 11/2005 | Yoshida et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055531 A1 | 3/2006 | Cook et al. |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0114159 A1 | 6/2006 | Yoshikawa et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0208900 A1 | 9/2006 | Tavassoli Hozouri |
| 2006/0214801 A1 | 9/2006 | Murofushi et al. |
| 2006/0220871 A1 | 10/2006 | Baba et al. |
| 2006/0244568 A1 | 11/2006 | Tong et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0015549 A1 | 1/2007 | Hernandez et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0122960 A1 | 5/2007 | Aoki |
| 2007/0132591 A1 | 6/2007 | Khatri |
| 2007/0164414 A1 | 7/2007 | Dokai et al. |
| 2007/0200705 A1 | 8/2007 | Yamagajo et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0252763 A1 | 11/2007 | Martin |
| 2007/0252770 A1 | 11/2007 | Kai et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0068132 A1 | 3/2008 | Kayanakis et al. |
| 2008/0070003 A1 | 3/2008 | Nakatani et al. |
| 2008/0074268 A1 | 3/2008 | Shafer |
| 2008/0087990 A1 | 4/2008 | Kato et al. |
| 2008/0111695 A1 | 5/2008 | Yamagajo et al. |
| 2008/0129606 A1 | 6/2008 | Yanagisawa et al. |
| 2008/0143630 A1 | 6/2008 | Kato et al. |
| 2008/0169905 A1 | 7/2008 | Slatter |
| 2008/0184281 A1 | 7/2008 | Ashizaki et al. |
| 2008/0246664 A1 | 10/2008 | Ikemoto et al. |
| 2008/0252551 A1 | 10/2008 | Kubo et al. |
| 2008/0272885 A1 | 11/2008 | Atherton |
| 2009/0002130 A1 | 1/2009 | Kato |
| 2009/0008460 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0066466 A1 | 3/2009 | Arimura |
| 2009/0080296 A1 | 3/2009 | Dokai et al. |
| 2009/0096696 A1 | 4/2009 | Joyce, Jr. et al. |
| 2009/0109034 A1 | 4/2009 | Chen et al. |
| 2009/0109102 A1 | 4/2009 | Dokai et al. |

(56) References Cited

U.S. PATENT DOCUMENTS

| | | | |
|---|---|---|---|
| 2009/0134979 A1 | 5/2009 | Tsukamoto et al. |
| 2009/0140947 A1 | 6/2009 | Sasagawa et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0266900 A1 | 10/2009 | Ikemoto et al. |
| 2009/0278687 A1 | 11/2009 | Kato |
| 2009/0284220 A1 | 11/2009 | Toncich et al. |
| 2009/0321527 A1 | 12/2009 | Kato et al. |
| 2010/0103058 A1 | 4/2010 | Kato et al. |
| 2010/0182210 A1 | 7/2010 | Ryou et al. |
| 2010/0283694 A1 | 11/2010 | Kato |
| 2010/0308118 A1 | 12/2010 | Kataya et al. |
| 2011/0031320 A1 | 2/2011 | Kato et al. |
| 2011/0063184 A1 | 3/2011 | Furumura et al. |
| 2011/0080331 A1 | 4/2011 | Kato |
| 2011/0186641 A1 | 8/2011 | Kato et al. |
| 2011/0253795 A1 | 10/2011 | Kato |
| 2012/0001701 A1 | 1/2012 | Taniguchi et al. |

FOREIGN PATENT DOCUMENTS

| | | | |
|---|---|---|---|
| CN | 101568933 A | 10/2009 |
| CN | 101578736 A | 11/2009 |
| DE | 10 2006 057 369 A1 | 6/2008 |
| EP | 0 694 874 A2 | 1/1996 |
| EP | 0 848 448 A2 | 6/1998 |
| EP | 0 948 083 A2 | 10/1999 |
| EP | 0 977 145 A2 | 2/2000 |
| EP | 1 010 543 A1 | 6/2000 |
| EP | 1 085 480 A1 | 3/2001 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 626 364 A2 | 2/2006 |
| EP | 1 701 296 A1 | 9/2006 |
| EP | 1 703 589 A1 | 9/2006 |
| EP | 1 742 296 A1 | 1/2007 |
| EP | 1 744 398 A1 | 1/2007 |
| EP | 1 840 802 A1 | 10/2007 |
| EP | 1 841 005 A1 | 10/2007 |
| EP | 1 865 574 A1 | 12/2007 |
| EP | 1 887 652 A1 | 2/2008 |
| EP | 1 976 056 A1 | 10/2008 |
| EP | 1 988 491 A1 | 11/2008 |
| EP | 1 988 601 A1 | 11/2008 |
| EP | 1 993 170 A1 | 11/2008 |
| EP | 2 009 738 A1 | 12/2008 |
| EP | 2 012 258 A1 | 1/2009 |
| EP | 2 096 709 A1 | 9/2009 |
| EP | 2 148 449 A1 | 1/2010 |
| EP | 2 166 617 A1 | 3/2010 |
| EP | 2 251 934 A1 | 11/2010 |
| EP | 2 256 861 A1 | 12/2010 |
| EP | 2 330 684 A1 | 6/2011 |
| GB | 2 305 075 A | 3/1997 |
| GB | 2461443 A | 1/2010 |
| GB | 2470299 A | 11/2010 |
| JP | 50-143451 A | 11/1975 |
| JP | 61-284102 A | 12/1986 |
| JP | 62-127140 U | 8/1987 |
| JP | 01-212035 A | 8/1989 |
| JP | 02-164105 A | 6/1990 |
| JP | 02-256208 A | 10/1990 |
| JP | 3-171385 A | 7/1991 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |
| JP | 04-134807 U | 12/1992 |
| JP | 5-95213 A | 4/1993 |
| JP | 05-226926 A | 9/1993 |
| JP | 05-327331 A | 12/1993 |
| JP | 6-53733 A | 2/1994 |
| JP | 06-077729 A | 3/1994 |
| JP | 06-029215 U | 4/1994 |
| JP | 06-177635 A | 6/1994 |
| JP | 6-260949 A | 9/1994 |
| JP | 07-183836 A | 7/1995 |
| JP | 08-055725 A | 2/1996 |
| JP | 08-056113 A | 2/1996 |
| JP | 8-87580 A | 4/1996 |
| JP | 08-088586 A | 4/1996 |
| JP | 08-88586 A | 4/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-093029 A | 4/1997 |
| JP | 09-245381 A | 9/1997 |
| JP | 09-252217 A | 9/1997 |
| JP | 09-270623 A | 10/1997 |
| JP | 09-284038 A | 10/1997 |
| JP | 09-294374 A | 11/1997 |
| JP | 9-512367 A | 12/1997 |
| JP | 10-069533 A | 3/1998 |
| JP | 10-69533 A | 3/1998 |
| JP | 10-084406 A | 3/1998 |
| JP | 10-505466 A | 5/1998 |
| JP | 10-171954 A | 6/1998 |
| JP | 10-173427 A | 6/1998 |
| JP | 10-193849 A | 7/1998 |
| JP | 10-193851 A | 7/1998 |
| JP | 10-242742 A | 9/1998 |
| JP | 10-293828 A | 11/1998 |
| JP | 10-334203 A | 12/1998 |
| JP | 2834584 B2 | 12/1998 |
| JP | 11-025244 A | 1/1999 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149537 A | 6/1999 |
| JP | 11-149538 U | 6/1999 |
| JP | 11-175678 A | 7/1999 |
| JP | 11-219420 A | 8/1999 |
| JP | 11-220319 A | 8/1999 |
| JP | 11-282993 A | 10/1999 |
| JP | 11-328352 A | 11/1999 |
| JP | 11-331014 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2000-048152 A | 2/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |

(56) References Cited

FOREIGN PATENT DOCUMENTS

| | | |
|---|---|---|
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2000-349680 A | 12/2000 |
| JP | 2001-10264 A | 1/2001 |
| JP | 2001-028036 A | 1/2001 |
| JP | 2001-043340 A | 2/2001 |
| JP | 3075400 U | 2/2001 |
| JP | 2001-66990 A | 3/2001 |
| JP | 2001-76111 A | 3/2001 |
| JP | 2001-084463 A | 3/2001 |
| JP | 2001-101369 A | 4/2001 |
| JP | 2001-505682 A | 4/2001 |
| JP | 2001-168628 A | 6/2001 |
| JP | 2001-188890 A | 7/2001 |
| JP | 2001-209767 A | 8/2001 |
| JP | 2001-240046 A | 9/2001 |
| JP | 2001-240217 A | 9/2001 |
| JP | 2001-256457 A | 9/2001 |
| JP | 2001-257292 A | 9/2001 |
| JP | 2001-514777 A | 9/2001 |
| JP | 2001-291181 A | 10/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351083 A | 12/2001 |
| JP | 2001-351084 A | 12/2001 |
| JP | 2001-352176 A | 12/2001 |
| JP | 2001-358527 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-042083 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-111363 A | 4/2002 |
| JP | 2002-143826 A | 5/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-175920 A | 6/2002 |
| JP | 2002-183676 A | 6/2002 |
| JP | 2002-183690 A | 6/2002 |
| JP | 2002-185358 A | 6/2002 |
| JP | 2002-204117 A | 7/2002 |
| JP | 2002-521757 A | 7/2002 |
| JP | 2002-522849 A | 7/2002 |
| JP | 2002-222398 A | 8/2002 |
| JP | 2002-230128 A | 8/2002 |
| JP | 2002-232221 A | 8/2002 |
| JP | 2002-245416 A | 8/2002 |
| JP | 2002-246828 A | 8/2002 |
| JP | 2002-252117 A | 9/2002 |
| JP | 2002-259934 A | 9/2002 |
| JP | 2002-280821 A | 9/2002 |
| JP | 2002-290130 A | 10/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-324221 A | 11/2002 |
| JP | 2002-325013 A | 11/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-022912 A | 1/2003 |
| JP | 2003-026177 A | 1/2003 |
| JP | 2003-030612 A | 1/2003 |
| JP | 2003-037861 A | 2/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099184 A | 4/2003 |
| JP | 2003-099720 A | 4/2003 |
| JP | 2003-099721 A | 4/2003 |
| JP | 2003-108966 A | 4/2003 |
| JP | 2003-110344 A | 4/2003 |
| JP | 2003-132330 A | 5/2003 |
| JP | 2003-134007 A | 5/2003 |
| JP | 2003-139866 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-308363 A | 10/2003 |
| JP | 2003-309418 A | 10/2003 |
| JP | 2003-317055 A | 11/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-096618 A | 3/2004 |
| JP | 2004-506905 A | 3/2004 |
| JP | 2004-104344 A | 4/2004 |
| JP | 2004-121412 A | 4/2004 |
| JP | 2004-126750 A | 4/2004 |
| JP | 2004-127230 A | 4/2004 |
| JP | 2004-140513 A | 5/2004 |
| JP | 2004-145449 A | 5/2004 |
| JP | 2004-163134 A | 6/2004 |
| JP | 2004-166175 A | 6/2004 |
| JP | 2004-166176 A | 6/2004 |
| JP | 2004-172919 A | 6/2004 |
| JP | 2004-213582 A | 7/2004 |

(56) References Cited

FOREIGN PATENT DOCUMENTS

| | | |
|---|---|---|
| JP | 2004-519916 A | 7/2004 |
| JP | 2004-234595 A | 8/2004 |
| JP | 20041070879 A | 8/2004 |
| JP | 2004-253858 A | 9/2004 |
| JP | 2004-527864 A | 9/2004 |
| JP | 2004-280390 A | 10/2004 |
| JP | 2004-282403 A | 10/2004 |
| JP | 2004-287767 A | 10/2004 |
| JP | 2004-295297 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-336604 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-006096 A | 1/2005 |
| JP | 2005-18156 A | 1/2005 |
| JP | 2005-033461 A | 2/2005 |
| JP | 2005-050581 A | 2/2005 |
| JP | 2005-064799 A | 3/2005 |
| JP | 2005-65075 A | 3/2005 |
| JP | 2005-124061 A | 5/2005 |
| JP | 2005-128592 A | 5/2005 |
| JP | 2005-129019 A | 5/2005 |
| JP | 2005-134942 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-192124 A | 7/2005 |
| JP | 2005-202943 A | 7/2005 |
| JP | 2005-204038 A | 7/2005 |
| JP | 2005-210223 A | 8/2005 |
| JP | 2005-210676 A | 8/2005 |
| JP | 2005-210680 A | 8/2005 |
| JP | 2005-217822 A | 8/2005 |
| JP | 2005-229474 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-277579 A | 10/2005 |
| JP | 2005-284352 A | 10/2005 |
| JP | 2005-284455 A | 10/2005 |
| JP | 2005-293537 A | 10/2005 |
| JP | 2005-295135 A | 10/2005 |
| JP | 2005-306696 A | 11/2005 |
| JP | 2005-311205 A | 11/2005 |
| JP | 2005-321305 A | 11/2005 |
| JP | 2005-322119 A | 11/2005 |
| JP | 2005-327622 A | 11/2005 |
| JP | 2005-328259 A | 11/2005 |
| JP | 2005-333244 A | 12/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-013976 A | 1/2006 |
| JP | 2006-025390 A | 1/2006 |
| JP | 2006-031766 A | 2/2006 |
| JP | 2006-033312 A | 2/2006 |
| JP | 2006-39902 A | 2/2006 |
| JP | 2006-039947 A | 2/2006 |
| JP | 2006-42059 A | 2/2006 |
| JP | 2006-42097 A | 2/2006 |
| JP | 2006-050200 A | 2/2006 |
| JP | 2006-053833 A | 2/2006 |
| JP | 2006-67479 A | 3/2006 |
| JP | 2006-72706 A | 3/2006 |
| JP | 2006-074348 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-238282 A | 9/2006 |
| JP | 2006-246372 A | 9/2006 |
| JP | 2006-270212 A | 10/2006 |
| JP | 2006-270681 A | 10/2006 |
| JP | 2006-270766 A | 10/2006 |
| JP | 2006-285911 A | 10/2006 |
| JP | 2006-287659 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-013120 A | 1/2007 |
| JP | 2007-13120 A | 1/2007 |
| JP | 2007-18067 A | 1/2007 |
| JP | 2007-019905 A | 1/2007 |
| JP | 2007-28002 A | 2/2007 |
| JP | 2007-028002 A | 2/2007 |
| JP | 2007-040702 A | 2/2007 |
| JP | 2007-043535 A | 2/2007 |
| JP | 2007-048126 A | 2/2007 |
| JP | 2007-65822 A | 3/2007 |
| JP | 2007-068073 A | 3/2007 |
| JP | 2007-79687 A | 3/2007 |
| JP | 2007-81712 A | 3/2007 |
| JP | 2007-096655 A | 4/2007 |
| JP | 2007-096768 A | 4/2007 |
| JP | 2007-102348 A | 4/2007 |
| JP | 2007-116347 A | 5/2007 |
| JP | 2007-122542 A | 5/2007 |
| JP | 2007-149757 A | 6/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-166133 A | 6/2007 |
| JP | 3975918 B2 | 6/2007 |
| JP | 2007-172369 A | 7/2007 |
| JP | 2007-172527 A | 7/2007 |
| JP | 2007-194924 A | 8/2007 |
| JP | 2007-524942 A | 8/2007 |
| JP | 2007-228254 A | 9/2007 |
| JP | 2007-228325 A | 9/2007 |
| JP | 2007-228437 A | 9/2007 |
| JP | 2007-233597 A | 9/2007 |
| JP | 2007-241789 A | 9/2007 |
| JP | 2007-249620 A | 9/2007 |
| JP | 2007-266999 A | 10/2007 |
| JP | 2007-272264 A | 10/2007 |
| JP | 2007-279782 A | 10/2007 |
| JP | 2007-287128 A | 11/2007 |
| JP | 2007-295177 A | 11/2007 |
| JP | 2007-295395 A | 11/2007 |

(56) References Cited

FOREIGN PATENT DOCUMENTS

| | | |
|---|---|---|
| JP | 2007-295557 A | 11/2007 |
| JP | 2007-312350 A | 11/2007 |
| JP | 2007-324865 A | 12/2007 |
| JP | 2008-033716 A | 2/2008 |
| JP | 2008-042379 A | 2/2008 |
| JP | 2008-042910 A | 2/2008 |
| JP | 2008-72243 A | 3/2008 |
| JP | 2008-083867 A | 4/2008 |
| JP | 2008-092131 A | 4/2008 |
| JP | 2008-097426 A | 4/2008 |
| JP | 2008-098993 A | 4/2008 |
| JP | 4069958 B2 | 4/2008 |
| JP | 2008-103691 A | 5/2008 |
| JP | 2008-107947 A | 5/2008 |
| JP | 2008-118359 A | 5/2008 |
| JP | 2008-513888 A | 5/2008 |
| JP | 2008-148345 A | 6/2008 |
| JP | 2008-519347 A | 6/2008 |
| JP | 2008-160821 A | 7/2008 |
| JP | 2008-160874 A | 7/2008 |
| JP | 2008-167190 A | 7/2008 |
| JP | 2008-182438 A | 8/2008 |
| JP | 2008-197714 A | 8/2008 |
| JP | 2008-535372 A | 8/2008 |
| JP | 2008-207875 A | 9/2008 |
| JP | 2008-211572 A | 9/2008 |
| JP | 2008-217406 A | 9/2008 |
| JP | 2008-226099 A | 9/2008 |
| JP | 2008-244739 A | 10/2008 |
| JP | 2008-252517 A | 10/2008 |
| JP | 2008-288915 A | 11/2008 |
| JP | 2008-294491 A | 12/2008 |
| JP | 2009-017284 A | 1/2009 |
| JP | 2009-021970 A | 1/2009 |
| JP | 2009-25870 A | 2/2009 |
| JP | 2009-027291 A | 2/2009 |
| JP | 2009-27291 A | 2/2009 |
| JP | 2009-037413 A | 2/2009 |
| JP | 2009-044647 A | 2/2009 |
| JP | 2009-044715 A | 2/2009 |
| JP | 3148168 U | 2/2009 |
| JP | 2009-065426 A | 3/2009 |
| JP | 2009-110144 A | 5/2009 |
| JP | 2009-111950 A | 5/2009 |
| JP | 2009-111986 A | 5/2009 |
| JP | 2009-130896 A | 6/2009 |
| JP | 2009-135166 A | 6/2009 |
| JP | 2009-524363 A | 6/2009 |
| JP | 2009-153166 A | 7/2009 |
| JP | 4301346 B2 | 7/2009 |
| JP | 2009-181246 A | 8/2009 |
| JP | 2009-182630 A | 8/2009 |
| JP | 2009-213169 A | 9/2009 |
| JP | 2009-213171 A | 9/2009 |
| JP | 2009-260758 A | 11/2009 |
| JP | 2009-278441 A | 11/2009 |
| JP | 2009-284182 A | 12/2009 |
| JP | 2010-009196 A | 1/2010 |
| JP | 2010-015342 A | 1/2010 |
| JP | 2010-504598 A | 2/2010 |
| JP | 2010-050844 A | 3/2010 |
| JP | 2010-051012 A | 3/2010 |
| JP | 2010-051017 A | 3/2010 |
| JP | 2010-074839 A | 4/2010 |
| JP | 2010-081571 | 4/2010 |
| JP | 2010-102445 A | 5/2010 |
| JP | 2010-171857 A | 8/2010 |
| JP | 4535209 B2 | 9/2010 |
| JP | 4561932 B2 | 10/2010 |
| JP | 2010-268306 A | 11/2010 |
| JP | 2010-279029 A | 12/2010 |
| JP | 2011-015395 A | 1/2011 |
| JP | 4609604 B2 | 1/2011 |
| JP | 2011-076567 A | 4/2011 |
| JP | 2011-139533 A | 7/2011 |
| JP | 2011-142648 A | 7/2011 |
| JP | 2011-205384 A | 10/2011 |
| JP | 2012-033021 A | 2/2012 |
| NL | 9100176 A | 3/1992 |
| NL | 9100347 A | 3/1992 |
| WO | 98/33142 A1 | 7/1998 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 2004/036772 A2 | 4/2004 |
| WO | 2004/070879 A | 8/2004 |
| WO | 20041072892 A2 | 8/2004 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/049068 A1 | 5/2006 |
| WO | 2006/114821 A1 | 11/2006 |
| WO | 2007/013168 A1 | 2/2007 |
| WO | 2007/060792 A1 | 5/2007 |
| WO | 2007/083574 A1 | 7/2007 |
| WO | 2007/083575 A1 | 7/2007 |
| WO | 2007/086130 A1 | 8/2007 |
| WO | 2007/094494 A1 | 8/2007 |
| WO | 2007/097385 A1 | 8/2007 |
| WO | 2007/099602 A1 | 9/2007 |
| WO | 2007/100092 A1 | 9/2007 |
| WO | 2007/102360 A1 | 9/2007 |
| WO | 2007/105348 A1 | 9/2007 |
| WO | 2007/119310 A1 | 10/2007 |
| WO | 2007/125683 A1 | 11/2007 |
| WO | 2007/132094 A1 | 11/2007 |
| WO | 2007/138857 A1 | 12/2007 |
| WO | 2008/001561 A1 | 1/2008 |
| WO | 2008/007606 A | 1/2008 |
| WO | 2008/081699 A1 | 7/2008 |
| WO | 2008/126458 A1 | 10/2008 |
| WO | 2008/133018 A1 | 11/2008 |
| WO | 2008/140037 A1 | 11/2008 |
| WO | 2008/142957 A1 | 11/2008 |
| WO | 2009/005080 A1 | 1/2009 |
| WO | 2009/008296 A1 | 1/2009 |
| WO | 2009/011144 A1 | 1/2009 |
| WO | 2009/011154 A1 | 1/2009 |
| WO | 2009/011376 A1 | 1/2009 |
| WO | 2009/011400 A1 | 1/2009 |
| WO | 2009/011423 A1 | 1/2009 |
| WO | 2009/048767 A1 | 4/2009 |
| WO | 2009/081719 A1 | 7/2009 |
| WO | 2009/110381 A1 | 9/2009 |
| WO | 2009/119548 A1 | 10/2009 |
| WO | 2009/128437 A1 | 10/2009 |
| WO | 2009/140220 A1 | 11/2009 |
| WO | 2009/142114 A1 | 11/2009 |
| WO | 2010/026939 A1 | 3/2010 |
| WO | 2010/050361 A1 | 5/2010 |
| WO | 2010/079830 A1 | 7/2010 |
| WO | 2010/104179 A1 | 9/2010 |
| WO | 2010/119854 A1 | 10/2010 |
| WO | 2011/062274 A1 | 5/2011 |

OTHER PUBLICATIONS

Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.

(56) References Cited

OTHER PUBLICATIONS

Kato et al.: "High-Frequency Device and Wireless IC Device"; U.S. Appl. No. 13/094,928, filed Apr. 27, 2011.
Dokai et al.: "Wireless IC Device"; U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official Communication issued in International Patent Application No. PCT/JP2010/053496, mailed on Jun. 1, 2010.
Ikemoto: "Wireless IC Tag, Reader-Writer, and Information Processing System"; U.S. Appl. No. 13/329,354, filed Dec. 19, 2011.
Kato et al.: "Antenna and Antenna Module"; U.S. Appl. No. 13/334,462, filed Dec. 22, 2011.
Official Communication issued in International Patent Application No. PCT/JP2010/069418, mailed on Feb. 8, 2011.
Official Communication issued in International Patent Application No. PCT/JP2010/063082, mailed on Nov. 16, 2010.
Ikemoto: "Communication Terminal and Information Processing System"; U.S. Appl. No. 13/412,772, filed Mar. 6, 2012.
"Antenna Engineering Handbook", The Institute of Electronics and Communication Engineers, Mar. 5, 1999, pp. 20-21.
Official Communication issued in International Patent Application No. PCT/JP2010/066714, mailed on Dec. 14, 2010.
Nomura et al.: "Antenna and Wireless IC Device"; U.S. Appl. No. 13/419,454, filed Mar. 14, 2012.
Official Communication issued in International Patent Application No. PCT/JP2010/070607, mailed on Feb. 15, 2011.
Ito: "Wireless IC Device and Method of Detecting Environmental State Using the Device"; U.S. Appl. No. 13/421,889, filed Mar. 16, 2012.
Official Communication issued in International Patent Application No. PCT/JP2011/053654, mailed on Mar. 29, 2011.
Kato et al.: "Antenna Device and Mobile Communication Terminal"; U.S. Appl. No. 13/425,505, filed Mar. 21, 2012.
Official Communication issued in International Patent Application No. PCT/JP2010/069416, mailed on Feb. 8, 2011.
Kato et al.: "Wireless Communication Device and Metal Article"; U.S. Appl. No. 13/429,465, filed Mar. 26, 2012.
Official Communication issued in International Patent Application No. PCT/JP2011/055344, mailed on Jun. 14, 2011.
Kubo et al.: "Antenna and Mobile Terminal"; U.S. Appl. No. 13/452,972, filed Apr. 23, 2012.
Ikemoto: "RFID System"; U.S. Appl. No. 13/457,525, filed Apr. 27, 2012.
Ikemoto et al.: "Wireless IC Device and Electronic Apparatus"; U.S. Appl. No. 13/468,058, filed May 10, 2012.
Official Communication issued in International Patent Application No. PCT/JP2010/066291, mailed on Dec. 28, 2010.
Ikemoto: "Communication Terminal and Information Processing System"; U.S. Appl. No. 13/432,002, filed Mar. 28, 2012.
Official Communication issued in International Patent Application No. PCT/JP2010/070767, mailed on Feb. 22, 2011.
Ieki et al.: "Transceiver and Radio Frequency Identification Tag Reader"; U.S. Appl. No. 13/437,978, filed Apr. 3, 2012.
Official Communication issued in International Patent Application No. PCT/JP2011/065431, mailed on Oct. 18, 2011.
Kato et al.: "Wireless IC Device"; U.S. Appl. No. 13/470,486, filed May 14, 2012.
Kato: "Wireless IC Device"; U.S. Appl. No. 12/789,610, filed May 28, 2010.
Kato: "Antenna and RFID Device"; U.S. Appl. No. 13/472,520, filed May 16, 2012.
Kato et al.: "Wireless IC Device and Component for Wireless IC Device"; U.S. Appl. No. 13/540,694, filed Jul. 3, 2012.
Dokai et al.: "Wireless IC Device and Component for Wireless IC Device"; U.S. Appl. No. 13/567,108, filed Aug. 6, 2012.
Dokai et al.: "Wireless IC Device and Component for Wireless IC Device"; U.S. Appl. No. 13/567,109, filed Aug. 6, 2012.
Official Communication issued in International Patent Application No. PCT/JP2011/052594, mailed on May 17, 2011.
Kato et al.: "Wireless IC Device"; U.S. Appl. No. 13/585,866, filed Aug. 15, 2012.
Kato et al.: "Radio Communication Device and Radio Communication Terminal"; U.S. Appl. No. 13/600,256, filed Aug. 31, 2012.
Murayama et al.: "Wireless Communication Module and Wireless Communication Device"; U.S. Appl. No. 13/598,872, filed Aug. 30, 2012.
Official Communication issued in International Patent Application No. PCT/JP2011/069689, mailed on Oct. 4, 2011.
Official Communication issued in corresponding Japanese Patent Application No. 2011-552116, mailed on Apr. 17, 2012.
Tsubaki et al.: "RFID Module and RFID Device"; U.S. Appl. No. 13/603,627, filed Sep. 5, 2012.
Kato et al.: "Antenna Device and Method of Setting Resonant Frequency of Antenna Device"; U.S. Appl. No. 13/604,807, filed Sep. 6, 2012.
Kato et al.: "Antenna Device and Method of Setting Resonant Frequency of Antenna Device"; U.S. Appl. No. 13/604,801, filed Sep. 6, 2012.
Official Communication issued in International Patent Application No. PCT/JP2011/053656, mailed on May 17, 2011.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.

(56) References Cited

OTHER PUBLICATIONS

Official Communication issued in International Patent Application No. PCT/JP2011/068110, mailed on Sep. 20, 2011.
Dokai et al.: "Antenna and Wireless Communication Device"; U.S. Appl. No. 13/613,021, filed Sep. 13, 2012.
Takeoka et al.: "Printed Wiring Board and Wireless Communication System"; U.S. Appl. No. 13/616,140, filed Sep. 14, 2012.
Dokai: "Wireless IC Device, Wireless IC Module and Method of Manufacturing Wireless IC Module"; U.S. Appl. No. 13/688,287, filed Nov. 29, 2012.
Official Communication issued in International Patent Application No. PCT/JP2011/067127, mailed on Oct. 18, 2011.
Kato et al.: "Wireless Communication Device and Metal Article"; U.S. Appl. No. 13/691,996, filed Dec. 3, 2012.
Yosui: "Antenna Apparatus and Communication Terminal Instrument"; U.S. Appl. No. 13/706,409, filed Dec. 6, 2012.
Official Communication issued in International Patent Application No. PCT/JP2011/071795, mailed on Dec. 27, 2011.
Dokai et al.: "Wireless IC Device"; U.S. Appl. No. 13/738,143, filed Jan. 10, 2013.
Official Communication issued in International Patent Application No. PCT/JP2011/074009, mailed on Dec. 20, 2011.
Kato et al.: "Electromagnetic-Coupling-Module-Attached Article"; U.S. Appl. No. 13/754,972, filed Jan. 31, 2013.
Kimura et al.: "Electrical Product"; U.S. Appl. No. 13/757,991, filed Feb. 4, 2013.
Nakano et al.: "Communication Terminal Device"; U.S. Appl. No. 13/760,196, filed Feb. 6, 2013.
Official Communication issued in International Patent Application No. PCT/JP2011/073054, mailed on Dec. 20, 2011.
Official Communication issued in International Patent Application No. PCT/JP2011/073490, mailed on Jan. 10, 2012.
Kato et al.: "Antenna Device and Communication Terminal Apparatus"; U.S. Appl. No. 13/761,195, filed Feb. 7, 2013.
Kato et al.: "Antenna Device and Mobile Communication Terminal"; U.S. Appl. No. 13/767,960, filed Feb. 15, 2013.
Official Communication issued in International Patent Application No. PCT/JP2012/058884, mailed on Jun. 12, 2012.
Dokai et al.: "Wireless Communication Device"; U.S. Appl. No. 13/782,346, filed Mar. 1, 2013.
Official Communication issued in International Patent Application No. PCT/JP2012/053344, mailed on May 22, 2012.
Official communication issued in counterpart International Application No. PCT/JP2008/071502, mailed Feb. 24, 2009.
Kato et al.: "Wireless IC Device and Manufacturing Method Thereof,"; U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Official communication issued in counterpart International Application No. PCT/JP2008/056026, mailed Jul. 1, 2008.
Ikemoto et al.: "Wireless IC Device and Electronic Apparatus,"; U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
Official Communication issued in International Patent Application No. PCT/JP2008/063025, mailed on Aug. 12, 2008.
Kato et al.: "Wireless IC Device,"; U.S. Appl. No. 12/603,608, filed Oct. 22, 2009.
Kato et al.: "Wireless IC Device,"; U.S. Appl. No. 12/688,072, filed Jan. 15, 2010.
Official Communication issued in International Patent Application No. PCl/JP2009/053693, mailed on Jun. 9, 2009.
Kato: "Composite Antenna,"; U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System,"; U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device,"; U.S. Appl. No. 12/861,945, filed Aug. 24, 2010.
Kato: "Wireless IC Device and Electromagnetic Coupling Module,"; U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in International Patent Application No. PCT/JP20121072849, mailed on Nov. 20, 2012.
Kimura et al.: "Wireless Communication Device"; U.S. Appl. No. 14/082,435, filed Nov. 18, 2013.
Kato: "Antenna Device and Wireless Device"; U.S. Appl. No. 14/085,830, filed Nov. 21, 2013.
Kato et al.: "Wireless IC Device Component and Wireless IC Device"; U.S. Appl. No. 14/151,852, filed Jan. 10, 2014.
Kato: "Wireless IC Device and Electromagnetic Coupling Module"; U.S. Appl. No. 14/160,597, filed Jan. 22, 2014.
Kato et al.: "Wireless IC Device"; U.S. Appl. No. 14/162,806, filed Jan. 24, 2014.
Kato et al.: "Antenna Device and Wireless Communication Device"; U.S. Appl. No. 14/171,004, filed Feb. 3, 2014.
Kato et al.: "Antenna and Wireless IC Device"; U.S. Appl. No. 14/182,339, filed Feb. 18, 2014.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.

(56) References Cited

OTHER PUBLICATIONS

Kato et al.: "Antenna Device and Method of Setting Resonant Frequency of Antenna Device"; U.S. Appl. No. 13/272,365, filed Oct. 13, 2011.
Official Communication issued in International Patent Application No. PCT/JP2010/056812, mailed on Jul. 13, 2010.
Dokai et al.: "Optical Disc"; U.S. Appl. No. 13/295,153, filed Nov. 14, 2011.
Official Communication issued in International Patent Application No. PCT/JP2010/057668, mailed on Aug. 17, 2010.
Osamura et al.: "Radio Frequency IC Device and Method of Manufacturing the Same"; U.S. Appl. No. 13/308,575, filed Dec. 1, 2011.
Official Communication issued in International Patent Application No. PCT/JP2010/069417, mailed on Dec. 7, 2010.
Kato: "Wireless IC Device and Coupling Method for Power Feeding Circuit and Radiation Plate"; U.S. Appl. No. 13/325,273, filed Dec. 14, 2011.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module,"; U.S. Appl. No. 12/536,663, filed Aug. 6, 2009.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2012/050557, mailed on Apr. 10, 2012.
Kimura et al.: "Wireless Communication Device"; U.S. Appl. No. 13/789,761, filed Mar. 8, 2013.
Dokai et al.: "RFID Chip Package and RFID Tag"; U.S. Appl. No. 13/792,650, filed Mar. 11, 2013.
Kato et al.: "Wireless IC Device Component and Wireless IC Device"; U.S. Appl. No. 13/794,929, filed Mar. 12, 2013.
Kato et al.: "Wireless IC Device and Component for Wireless IC Device"; U.S. Appl. No. 13/848,748, filed Mar. 22, 2013.
Official Communication issued in International Patent Application No. PCT/JP2012/080493, mailed on Dec. 25, 2012.
Mukai et al.: "Inspection Method and Inspection Device for RFID Tag"; U.S. Appl. No. 13/933,184, filed Jul. 2, 2013.
Kato et al.: "Antenna Device and Method of Setting Resonant Frequency of Antenna Device"; U.S. Appl. No. 13/941,760, filed Jul. 15, 2013.
Kato et al.: "Antenna Device and Method of Setting Resonant Frequency of Antenna Device"; U.S. Appl. No. 13/943,973, filed Jul. 17, 2013.
Official Communication issued in International Patent Application No. PCT/JP2012/080700, mailed on Jan. 15, 2013.
Mukai et al.: "Wireless Integrated Circuit Device and Method of Manufacturing the Same"; U.S. Appl. No. 13/961,995, filed Aug. 8, 2013.
Kato et al.: "Radio IC Device"; U.S. Appl. No. 13/964,234, filed Aug. 12, 2013.
Official Communication issued in International Patent Application No. PCT/JP2012/067779, mailed on Aug. 28, 2012.
Official Communication issued in International Patent Application No. PCT/JP2013/051254, mailed on Apr. 2, 2013.
Dokai: "Wireless Communication Device"; U.S. Appl. No. 13/970,633, filed Aug. 20, 2013.
Official Communication issued in International Patent Application No. PCT/JP2012/059350, mailed on Jul. 3, 2012.
Dokai: "Wireless IC Device"; U.S. Appl. No. 14/011,823, filed Aug. 28, 2013.
Official Communication issued in International Patent Application No. PCT/JP2012/055505, mailed on Jun. 5, 2012.
Kato: "Radio IC Device and Radio Communication Terminal"; U.S. Appl. No. 14/017,406, filed Sep. 4, 2013.
Official Communication issued in International Patent Application No. PCT/JP2012/067454, mailed on Aug. 7, 2012.
Kato: "Antenna Device and Communication Terminal Apparatus"; U.S. Appl. No. 14/019,573, filed Sep. 6, 2013.
Official Communication issued in International Patent Application No. PCT/JP2012/067537, mailed on Oct. 9, 2012.
Kato: "Radio Communication Device"; U.S. Appl. No. 14/027,387, filed Sep. 16, 2013.
Kato: "Antenna Device, RFID Tag, and Communication Terminal Apparatus"; U.S. Appl. No. 14/031,270, filed Sep. 19, 2013.
Kato et al.: "Wireless IC Device"; U.S. Appl. No. 14/054,865, filed Oct. 16, 2013.
Official Communication issued in International Patent Application No. PCT/JP2012/062259, mailed on Jun. 12, 2012.
Dokai et al.: "Radio IC Device"; U.S. Appl. No. 14/078,596, filed Nov. 13, 2013.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.

(56) References Cited

OTHER PUBLICATIONS

Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in corresponding Japanese Patent Application No. 2013-192650, mailed on Nov. 18, 2014.

WIRELESS COMMUNICATION DEVICE

BACKGROUND OF THE INVENTION

1. Field of the Invention

The present invention relates to wireless communication devices, and specifically to wireless communication devices that communicate with readers/writers in radio frequency identification (RFID) systems.

2. Description of the Related Art

Known article management systems include an RFID system in which a reader/writer communicates with RFID tags (also called wireless IC devices) in a noncontact manner, whereby information is transmitted between the reader/writer and the RFID tags. An RFID tag includes a wireless IC chip for processing wireless signals and an antenna for transmitting/receiving wireless signals, and predetermined information is transmitted/received as high-frequency signals between the antenna of an RFID tag and the antenna of a reader/writer via a magnetic field or an electric field.

Generally, dipole antennas are used as antennas of RFID tags, as described in Japanese Unexamined Patent Application Publication No. 2004-104344, Japanese Unexamined Patent Application Publication No. 2009-524363, and International Publication No. 2007/013168. A dipole antenna, which transmits/receives signals mainly using an electric field, has a long communication range when used by itself. However, when an object with a large relative dielectric constant or a large electroconductivity is in the vicinity of the antenna, the radiation characteristics are likely to change.

SUMMARY OF THE INVENTION

Preferred embodiments of the present invention provide a wireless communication device that has stable communication characteristics that are not particularly dependent on the surrounding environment.

A wireless communication device according to a preferred embodiment of the present invention includes a wireless IC chip that processes a high-frequency signal, and a feeding substrate including a coil conductor, a plane conductor, and a matching circuit that is connected to the wireless IC chip and that has a predetermined resonant frequency, wherein the coil conductor and the plane conductor are connected to the matching circuit, the wireless communication device, when used by itself, operates as a monopole antenna in which the plane conductor functions as a ground and the coil conductor functions as a radiation element, and when a conductive object is in a vicinity of the plane conductor, the plane conductor is coupled to the conductive object and the wireless communication device operates as a dipole antenna in which the plane conductor and the conductive object function as a first radiation element and the coil conductor functions as a second radiation element.

The wireless communication device, when used by itself, behaves as a monopole antenna in which the plane conductor connected to the matching circuit that is coupled to the wireless IC chip functions as the ground and the coil conductor connected to the matching circuit functions as an antenna element, and the wireless communication device transmits and receives high-frequency signals to and from the antenna of a communication partner. On the other hand, when there is a nearby conductive object such as a metal member, the plane conductor and the conductive object are coupled to each other, and the wireless communication device behaves as a dipole antenna in which the plane conductor and the conductive object function as a first radiation element and the coil conductor functions as a second radiation element, and the wireless communication device transmits and receives high-frequency signals to and from the antenna of a communication partner.

The wireless communication device according to a preferred embodiment of the present invention behaves as a monopole antenna or a dipole antenna in accordance with the existence/nonexistence of a nearby conductive object and, hence, exhibits stable communication characteristics that are not particularly dependent on the surrounding environment.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 4A-4C illustrate a first type of operation of the wireless communication device, where

FIGS. 5A-5C illustrate a second type of operation of the wireless communication device, where

DETAILED DESCRIPTION OF THE PREFERRED EMBODIMENTS

Hereinafter, preferred embodiments of a wireless communication device according to the present invention will be described with reference to the attached drawings. Note that identical components and portions in the figures are denoted by the same reference symbols and duplicate descriptions thereof are omitted.

Figure 1:
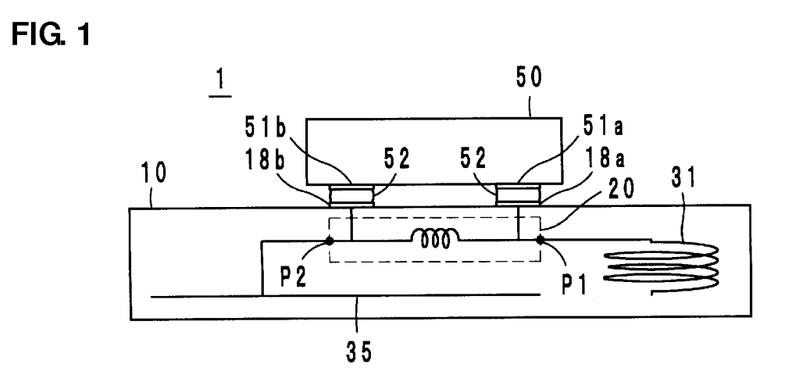
FIG. 1 is a schematic configuration diagram of a wireless communication device according to a preferred embodiment of the present invention.

Referring to FIG. 1, a wireless communication device 1 according to a preferred embodiment of the present invention, which is preferably used in a UHF band RFID system, includes a wireless IC chip 50 functioning as a feeding circuit and a feeding substrate 10 that includes a matching circuit 20 having a predetermined resonant frequency and coupled to the wireless IC chip 50, a coil conductor 31, and a plane conductor 35. The coil conductor 31 and the plane conductor 35 are electrically connected in parallel with the matching circuit 20. One end of the coil conductor 31 is connected to a first connection point P1 of the matching circuit 20 and the other end is open. The plane conductor 35 is provided on the bottom surface side of the feeding substrate 10 over a relatively wide area and is connected to a second connection point P2 of the matching circuit 20. Note that the matching circuit 20 is illustrated in a simplified manner in FIG. 1.

The wireless IC chip 50, which is mounted on the feeding substrate 10, has a function of processing high-frequency signals, and preferably is a silicon semiconductor integrated circuit chip, for example. The wireless IC chip 50 includes a clock circuit, a logic circuit, a memory circuit, and the like, and stores necessary information. The wireless IC chip 50 includes a pair of input/output terminals, which define balanced terminals.

Figure 2:
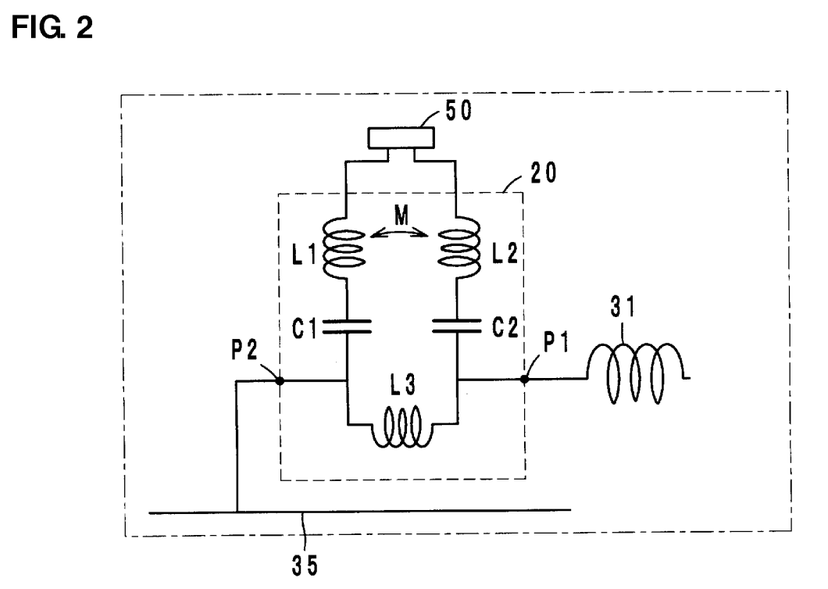
FIG. 2 is an equivalent circuit diagram of the wireless communication device.

Referring to FIG. 2, the matching circuit 20 includes inductance elements L1 and L2 and capacitance elements C1 and C2. The inductance elements L1 and L2 are electrically connected in parallel with the wireless IC chip 50. In other words, the matching circuit 20 is inserted between the pair of balanced terminals. The capacitance element C1 is connected in series with the inductance element L1, thereby defining a first series resonant circuit. The capacitance element C2 is connected in series with the inductance element L2 so as to define a second series resonant circuit.

In other words, the matching circuit 20 has a predetermined resonant frequency that is determined by the first and second series resonant circuits. The plane conductor 35 is connected to the capacitance element C1 of the first series resonant circuit, and the coil conductor 31 is connected to the capacitance element C2 of the second series resonant circuit. The inductance elements L1 and L2 respectively include windings wound in opposite directions so as to define a closed magnetic path, and there is strong magnetic coupling M therebetween. An inductance element L3 that adjusts the coupling value of the magnetic coupling M is inserted between the capacitance elements C1 and C2 that respectively define portions of the first and second series resonant circuits.

Figure 3:
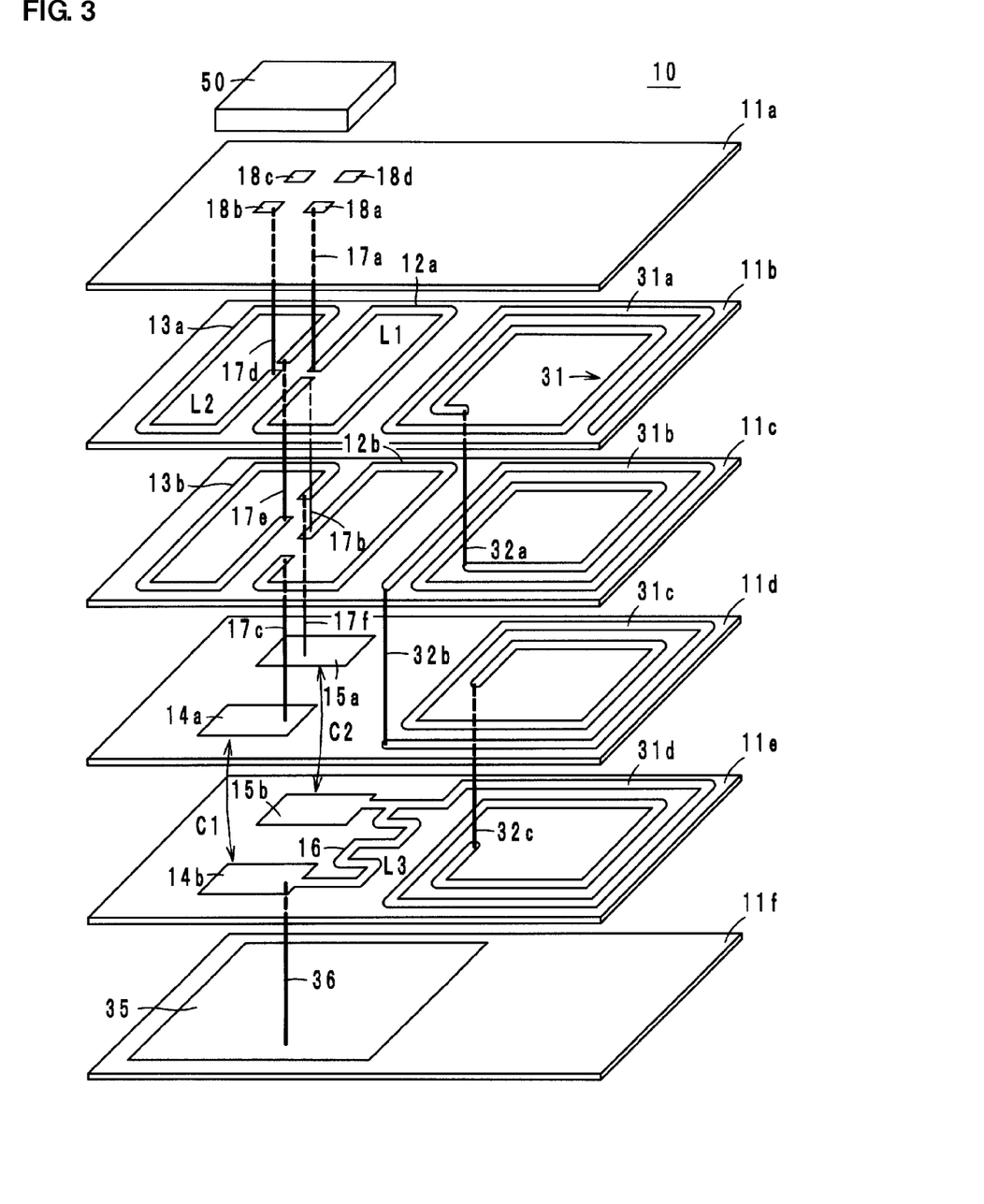
FIG. 3 is an exploded perspective view of a feeding substrate of the wireless communication device.

Referring to FIG. 3, the feeding substrate 10 preferably is a multilayer substrate which is preferably formed by stacking a plurality of dielectric layers or magnetic layers. Connection electrodes 18a to 18d are provided on the top surface of a first layer 11a, coil patterns 12a, 13a, and 31a are provided on the top surface of a second layer 11b, and coil patterns 12b, 13b, and 31b are provided on the top surface of a third layer 11c. Further, capacitor patterns 14a and 15a and a coil pattern 31c are provided on the top surface of a fourth layer 11d, and capacitor patterns 14b and 15b, a meandering pattern 16, and a coil pattern 31d are provided on the top surface of a fifth layer 11e. The plane conductor 35 is provided on the top surface of a sixth layer 11f.

Note that in the present preferred embodiment, the first layer 11a to the fifth layer 11e are dielectric layers and only the sixth layer 11f is a magnetic layer.

By stacking the layers 11a to 11f, the coil patterns 12a and 12b are connected to each other through a via-hole conductor 17b so as to define the inductance element L1, and the coil patterns 13a and 13b are connected to each other through a via-hole conductor 17e so as to define the inductance element L2. The capacitor patterns 14a and 14b face each other, and the capacitor patterns 15a and 15b face each other, so as to respectively define the capacitance elements C1 and C2. The coil patterns 31a to 31d are connected to one another in a spiral shape through via-hole conductors 32a to 32c so as to define the multilayer coil conductor 31.

The meandering pattern 16 defines the inductance element L3, and one end thereof is connected to the capacitor pattern 14b and the other end thereof is connected to the capacitor pattern 15b and an end of the coil pattern 31d. The connection electrode 18a is connected to one end of the inductance element L1 (the coil pattern 12a) through a via-hole conductor 17a. The connection electrode 18b is connected to one end of the inductance element L2 (the coil pattern 13a) through a via-hole conductor 17d. Further, the other end of the inductance element L1 (the coil pattern 12b) is connected to the capacitor pattern 14a through a via-hole conductor 17c. The other end of the inductance element L2 (the coil pattern 13b) is connected to the capacitor pattern 15a through a via-hole conductor 17f. Further, the capacitor pattern 14b is connected to the plane conductor 35 through a via-hole conductor 36.

Note that various ceramic materials can be used as the dielectric layers or magnetic layer defining the feeding substrate 10. Resin materials such as polyimide and liquid crystal polymers may be used. When the feeding substrate 10 is formed of a ceramic material, the conductive patterns provided on the layers are preferably formed using a conductive paste mainly composed of a low-melting point material, such as silver or gold, for example, which has a low resistivity and can enhance high-frequency characteristics. When the feeding substrate 10 is formed of a resin material, the conductor patterns may be formed by etching a metal foil or metal film of, for example, silver or copper.

In other words, in the present preferred embodiment, the feeding substrate 10 is a multilayer substrate and the matching circuit 20 is provided within the feeding substrate 10. However, it is not necessary to dispose all the elements L1, L2, L3, C1, and C2 within the feeding substrate 10.

The wireless IC chip 50 includes a pair of input/output electrodes 51a and 51b (refer to FIG. 1) to receive a high-frequency signal as a potential difference. The input/output electrodes 51a and 51b are connected to the connection electrodes 18a and 18b provided on the feeding substrate 10 using, for example, solder bumps 52.

Figure 4A:
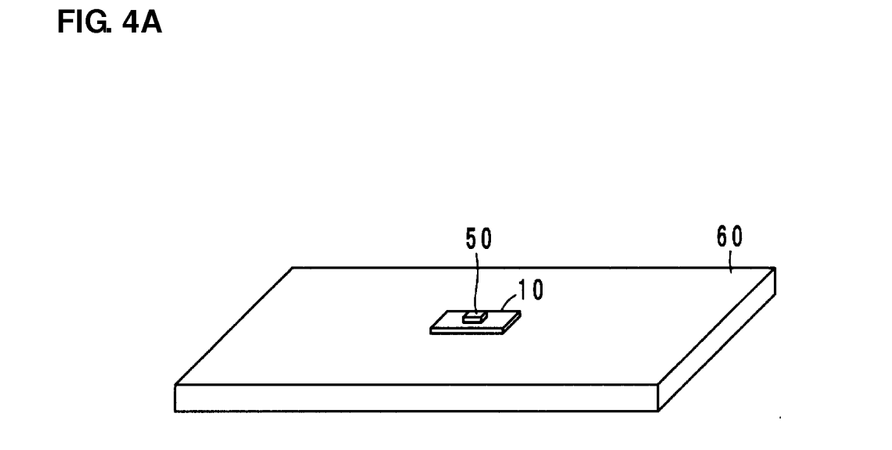
FIG. 4A is a perspective view.
Figure 4B:
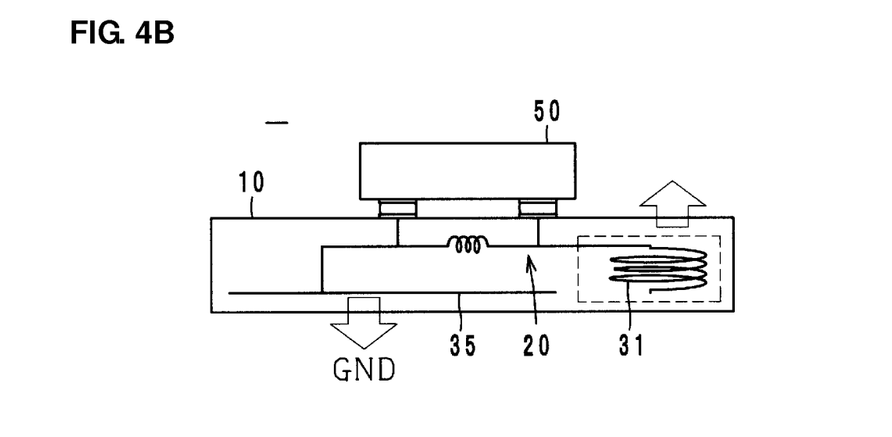
FIG. 4B is an operation explanation diagram.
Figure 4C:
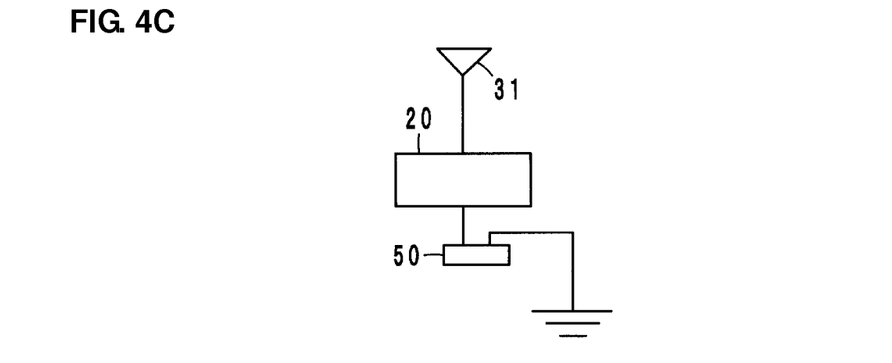
FIG. 4C is an equivalent circuit diagram for during operation.

Referring to FIG. 4, the wireless communication device 1 is used in such a manner as to be mounted on a printed circuit board 60. When a conductive object such as a ground plate or metal casing is not present in the vicinity of the wireless communication device 1, the wireless communication device 1 behaves as a monopole antenna in which the plane conductor 35 connected to the matching circuit 20 that is coupled to the wireless IC chip 50 functions as the ground and the coil conductor 31 connected to the matching circuit 20 functions as a radiation element, and the wireless communication device 1 transmits and receives high-frequency signals to and from the antenna of a reader/writer, which is not illustrated, over a relatively short distance (for example, about 10 cm or less) using an electromagnetic field (mainly magnetic field).

Figure 5A:
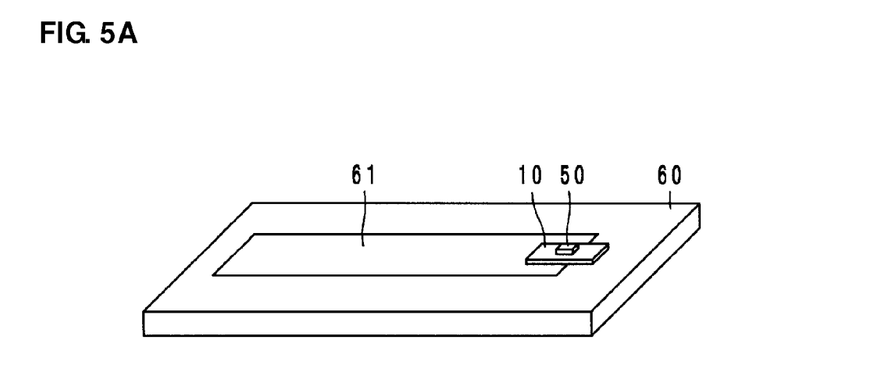
FIG. 5A is a perspective view.
Figure 5B:
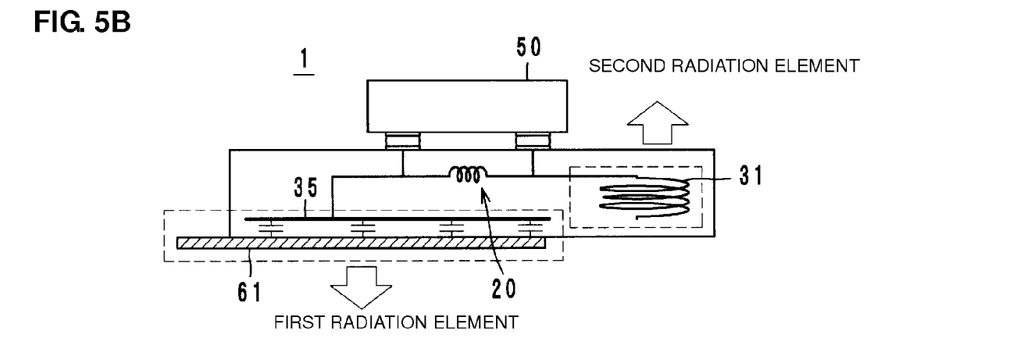
FIG. 5B is an operation explanation diagram.
Figure 5C:
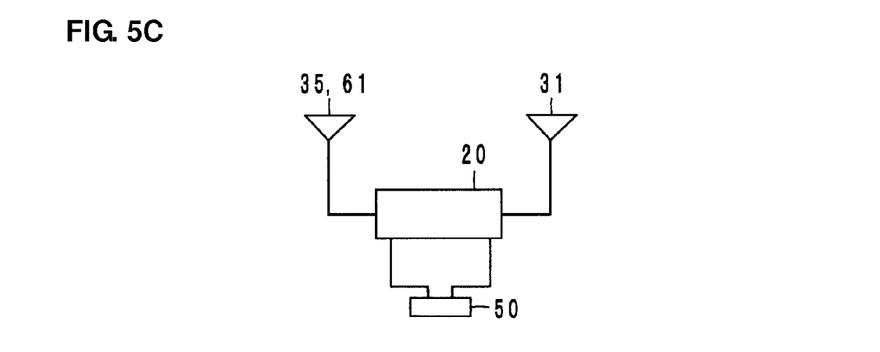
FIG. 5C is an equivalent circuit diagram for during operation.

On the other hand, referring to FIG. 5, when a conductive object 61, such as a ground plate, is provided on the printed circuit board 60, that is, when the conductive object 61 such as a ground plate or a metal casing is in the vicinity of the plane conductor 35, the wireless communication device 1 behaves as a dipole antenna in which the plane conductor 35 and the conductive object 61, which are capacitively coupled to each other, function as a first radiation element and the coil conductor 31 functions as a second radiation element, and the wireless communication device 1 transmits and receives high-frequency signals to and from the antenna of a reader/writer, which is not illustrated, over a relatively long distance (for example, about 30 cm or more) using an electromagnetic field (mainly magnetic field).

Figure 6:
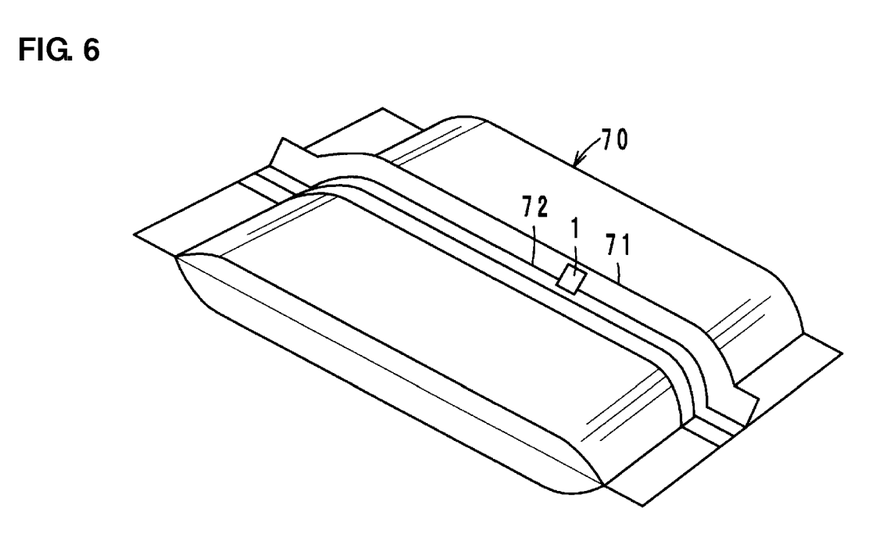
FIG. 6 is a perspective view illustrating an example of mounting of the wireless communication device.

In the above preferred embodiment, in describing the wireless communication device 1, a non-limiting example of a manner in which the wireless communication device 1 is mounted on the printed circuit board 60 has been described. Other than this, the wireless communication device 1 may be mounted on various articles or the packages of the articles. FIG. 6 illustrates a manner in which the wireless communication device 1 is mounted on a package 70 of a food product. The package 70 is a package with an evaporated aluminum film all over the surface thereof, and the wireless communication device 1 is attached to a seam portion 71 which is the periphery of a conductive evaporated aluminum film 72.

Note that the wireless communication device according to the present invention is not limited to the preferred embodiment described above, and various modifications are possible within the scope of the present invention.

In particular, the matching circuit can include various circuit elements, and is not limited to the circuit configuration which uses the inductance elements L1 and L2 and the capacitance elements C1 and C2 illustrated in the preferred embodiment described above. Further, the coupling between the matching circuit and the wireless IC chip may be any of magnetic coupling, capacitive coupling, electric field coupling, electromagnetic coupling, and direct current coupling. The coupling between the plane conductor 35 and the conductive object 61 may instead be any of magnetic coupling, electric field coupling, electromagnetic coupling, and direct current coupling, rather than capacitive coupling.

The wireless IC chip, rather than being mounted on the top surface of the feeding substrate, may be disposed within the feeding substrate (housed in a cavity formed in the feeding substrate) or may be mounted on a substrate other than the feeding substrate.

As described above, preferred embodiments of the present invention and modifications thereof are useful in wireless communication devices, and specifically provide an advantage in that stable communication characteristics that are not particularly dependent on the surrounding environment are realized.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An RFID system comprising:
    an article including a conductive object; and
    a wireless communication device attached to the article; wherein
    the wireless communication device includes:
        a wireless IC chip that processes a high-frequency signal; and
        a feeding substrate including a first conductor, a second conductor, and a matching circuit, in which the matching circuit is connected to the wireless IC chip, and the first and second conductors are connected to the matching circuit; wherein
        the first conductor is connected to the conductive object and one end of the second conductor is an open-end such that the conductive object functions as a first radiation element and the second conductor functions as a second radiation element.

2. The RFID system according to claim 1, wherein the first conductor and the conductive object are connected to each other by at least one of magnetic coupling, capacitive coupling, electric field coupling, electromagnetic coupling, and direct current coupling.

3. The RFID system according to claim 2, wherein the first conductor is capacitively coupled to the conductive object.

4. The RFID system according to claim 1, wherein the matching circuit includes an inductance element which is provided between the first and second conductor.

5. The RFID system according to claim 1, wherein the matching circuit includes a first inductance element and a second inductance element, and the first and second inductance elements are electrically connected in parallel with the wireless IC chip and are magnetically coupled to each other.

6. The RFID system according to claim 1, wherein the feeding substrate includes a multilayer body including a plurality of dielectric layers or magnetic layers stacked on each other, and the matching circuit is located within the multilayer body.

7. The RFID system according to claim 1, wherein the second conductor comprises a multilayer coil pattern including a plurality of loop-shaped conductors stacked on and connected to each other in a spiral shape.

8. The RFID system according to claim 1, wherein the wireless IC chip is a silicon semiconductor integrated circuit chip including a clock circuit, a logic circuit, and a memory circuit.

9. The RFID system according to claim 1, wherein the article is a printed circuit board and the conductive object is a ground plate of the printed circuit board.

10. The RFID system according to claim 1, wherein the wireless IC chip is mounted on or disposed within the feeding substrate.

11. The RFID system according to claim 1, which is used in a UHF band RFID system.

* * * * *